United States Patent [19]

Kwong et al.

[11] Patent Number: 5,478,765
[45] Date of Patent: Dec. 26, 1995

[54] METHOD OF MAKING AN ULTRA THIN DIELECTRIC FOR ELECTRONIC DEVICES

[75] Inventors: Dim-Lee Kwong; Giwan Yoon; Jonghan Kim; Liang-Kai Han; Jiang Yan, all of Austin, Tex.

[73] Assignee: Regents of the University of Texas System, Austin, Tex.

[21] Appl. No.: 237,745

[22] Filed: May 4, 1994

[51] Int. Cl.$^6$ .................... H01L 21/336; H01L 21/318
[52] U.S. Cl. .................. 437/40; 437/41; 437/242; 437/978; 437/983; 437/919
[58] Field of Search ............... 257/411; 437/40 GS, 437/41 GS, 242, 978, 983, 919; 148/DIG. 43, DIG. 112

[56] References Cited

U.S. PATENT DOCUMENTS

| | | | |
|---|---|---|---|
| 3,422,321 | 1/1969 | Tombs | 317/235 |
| 3,629,088 | 12/1971 | Frank et al. | 204/192 |
| 4,188,565 | 2/1980 | Mizukami et al. | 313/509 |
| 4,266,985 | 5/1981 | Ito et al. | |
| 4,438,157 | 3/1984 | Romano-Morn | 427/93 |
| 4,581,622 | 4/1986 | Takasaki et al. | 357/23.5 |
| 4,620,986 | 11/1986 | Yau et al. | 427/93 |
| 4,702,936 | 10/1987 | Maeda et al. | 427/54.1 |
| 4,721,631 | 1/1988 | Endo et al. | 427/66 |
| 4,901,133 | 2/1990 | Curran et al. | 357/54 |
| 5,013,692 | 5/1991 | Ide et al. | |
| 5,032,545 | 7/1991 | Doan et al. | |
| 5,219,773 | 6/1993 | Dunn | |
| 5,258,333 | 11/1993 | Shappir et al. | |
| 5,319,229 | 6/1994 | Shimoji et al. | |
| 5,397,720 | 3/1995 | Kwong et al. | |
| 5,407,870 | 4/1995 | Okada et al. | |

FOREIGN PATENT DOCUMENTS

| | | |
|---|---|---|
| 0259826 | 3/1988 | European Pat. Off. . |
| 0289246 | 11/1988 | European Pat. Off. . |
| 0305741 | 3/1989 | European Pat. Off. . |
| 5333580 | 3/1978 | Japan . |
| 57-63832 | 4/1982 | Japan . |
| 58-90778 | 5/1983 | Japan . |
| 61-288472 | 12/1986 | Japan . |
| 62-293728 | 12/1987 | Japan . |
| 1169932 | 7/1989 | Japan . |
| 8302199 | 6/1983 | WIPO . |
| 8400852 | 3/1984 | WIPO . |
| 8605323 | 9/1985 | WIPO . |
| 8705439 | 9/1987 | WIPO . |
| 9003560 | 4/1990 | WIPO . |

OTHER PUBLICATIONS

Hwang, et al., "Electrical Characteristics Of Ultrathin Oxy–Nitride Gate Dielectric Prepared By Rapid Thermal Oxidation . . . " Appl. Phys. Lett. 57 (10), 3 Sep. 1990, pp. 1010–1011.

Hwang, et al., "Electrical And Reliability Characteristics Of Ultrathin Oxynitride Gate Dielectric Prepared By Rapid Ther . . . " I.E.D.M. 90–421, 1990, pp. 16.5.1–16.5.4.

Ting, et al., "Composition And Growth Kinetics Of Ultrathin $SiO_2$ Films Formed By Oxidizing Si Substrates In $N_2O$," Appl. Phys. Lett. 57 (26), 24 Dec. 1990, pp. 2808–2810.

Hwang, et al., "Improved Reliability Characteristics Of Sub–Micron NMOSFETS With Oxynitride Gate Dielectric Prepared By . . . " Elec. Dev. Lett., Mar. 25, 1991, pp. 1–14.

*Primary Examiner*—George Fourson
*Attorney, Agent, or Firm*—Townsend and Townsend and Crew

[57] ABSTRACT

High quality, ultra thin (<30 Å) $SiO_2/Si_3N_4$(ON) dielectric layers have been fabricated by in situ multiprocessing and low pressure rapid-thermal $N_2O$-reoxidation (LRTNO) of $Si_3N_4$ films. $Si_3N_4$ film was deposited on the RTN-treated polysilicon by rapid-thermal chemical vapor deposition (RT-CVD) using $SiH_4$ and $NH_3$, followed by in situ low pressure rapid-thermal reoxidation in $N_2O$ (LRTNO) or in $O_2$ (LRTO) ambient. Results show that ultra thin ($T_{ox,eq}$=~29Å) ON stacked film capacitors with LRTNO have excellent electrical properties and reliability.

9 Claims, 10 Drawing Sheets

5,478,765

METHOD OF MAKING AN ULTRA THIN DIELECTRIC FOR ELECTRONIC DEVICES

BACKGROUND OF THE INVENTION

This invention relates generally to electronic devices such as capacitors and metal-insulator-field effect transistors (MISFETs), and more particularly the invention relates to dielectric material used therein.

The rapid reduction in cell size of dynamic random access memories (DRAM) has necessitated innovative cell structures and highly reliable ultra thin dielectrics. Silicon nitride ($Si_3N_4$) remains the most practical capacitor dielectric from a module integration and manufacturing perspective due to its process simplicity. However, electrical properties of the ultra thin film capacitors degrade due to the bottom native oxides. Rapid-thermal $NH_3$-nitridation (RTN) in situ HF cleaning, and in situ rapid-thermal multiprocessing can remove the native oxides, leading to the improvement of film quality. Reoxidation of $Si_3N_4$ film, typically in an oxygen ambient, is used to reduce leakage current and pinhole density.

The MIS transistor is used in ultra large scale integrated (ULSI) microelectronic circuits such as DRAMs. The transistor includes a current carrier source region formed in a surface of a semiconductor (e.g., silicon) body, a carrier drain region formed in the surface and spaced from the source, and a channel region between the source and drain in which the current carriers flow. Overlying the channel region and aligned with the edges of the source and drain is a gate electrode which is physically and electrically separated from the channel by a dielectric layer. Typically, the dielectric comprises a silicon oxide.

The present invention is directed to providing high quality ultra thin dielectric layers and capacitors, field effect transistors, and other electronic devices.

SUMMARY OF THE INVENTION

In accordance with the invention, a dielectric layer including thermally-grown $Si_3N_4$, chemically vapor-deposited $Si_3N_4$, and an oxynitride (ON) layer is provided which is especially suitable for electronic devices requiring high quality and ultra thin (e.g., less than 30 Å) dielectrics.

An in situ process for fabricating the dielectric includes rapid-thermal nitridation in ammonia ($NH_3$) to remove native oxides is followed by $Si_3N_4$ film deposition. Rapid-thermal reoxidation in nitrous oxide ($N_2O$) is then employed to form a thin, high-quality ON layer on the $Si_3N_4$ layers. The rapid-thermal oxidation is carried out using a low pressure rapid-thermal $N_2O$ reoxidation (LRTNO). The low pressure process results in a very thin ON layer by suppressing severe oxidation. Additionally, the quality of the stacked film improves, resulting in low leakage current, reduced defect density, and superior breakdown characteristics.

The invention and objects and features thereof will be more readily apparent from the following detailed description and appended claims when taken with the drawings.

DETAILED DESCRIPTION OF ILLUSTRATIVE EMBODIMENTS

Figure 1:
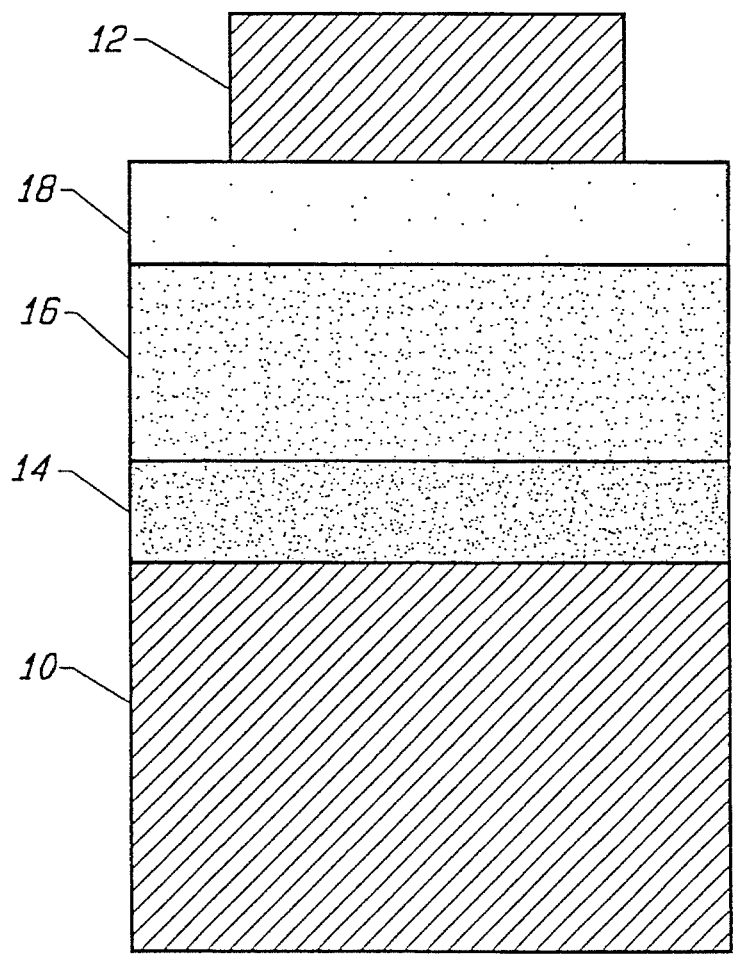
FIG. 1 is a section view of a stacked capacitor for use in a DRAM in accordance with the invention.

FIG. 1 is a section view of a capacitor useful in a DRAM in accordance with one embodiment of the invention. Conventionally, the bottom contact 10 of the capacitor comprises a doped portion of a supporting semiconductor substrate and the top electrode 12 comprises a doped polysilicon electrode. Therebetween is the dielectric layer which, in accordance with the present invention, comprises a first layer 14 of $Si_3N_4$ formed by rapid-thermal nitridation of the silicon surface in an atmosphere of ammonia ($NH_3$). A second layer 16 of chemically vapor-deposited $Si_3N_4$ is formed over the thermally grown layer 14, and a cap layer of ON is grown on the surface of the vapor-deposited $Si_3N_4$.

Figure 2:
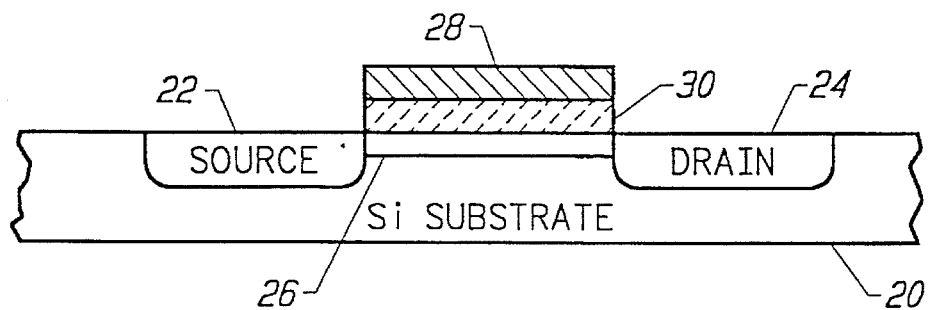
FIG. 2 is a section view of a MISFET in accordance with another embodiment of the invention.

While the dielectric film, in accordance with the invention, is typically advantageous for use in capacitors of a dynamic random access memory, the dielectric can also be employed in a MIS transistor such as the metal oxide semiconductor (MOS) transistor shown in section view of FIG. 2. The transistor is formed in a silicon substrate 20 with a carrier source region 22 and a carrier drain region 24 formed in a major surface of the substrate. The source and drain are separated by a channel region 26 through which current carriers flow. Control of the conduction of the carriers through the channel 26 is achieved by voltage biasing a gate electrode 28 spaced from the channel region in alignment with edges of the source and drain and separated from the substrate by dielectric 30. The dielectric 30 can have the same structure as that shown in FIG. 1 and is particularly advantageous in ultra large scale integrated (ULSI) microelectronic circuits such as DRAMs where high quality ultra thin gate dielectrics are required.

Figure 3:
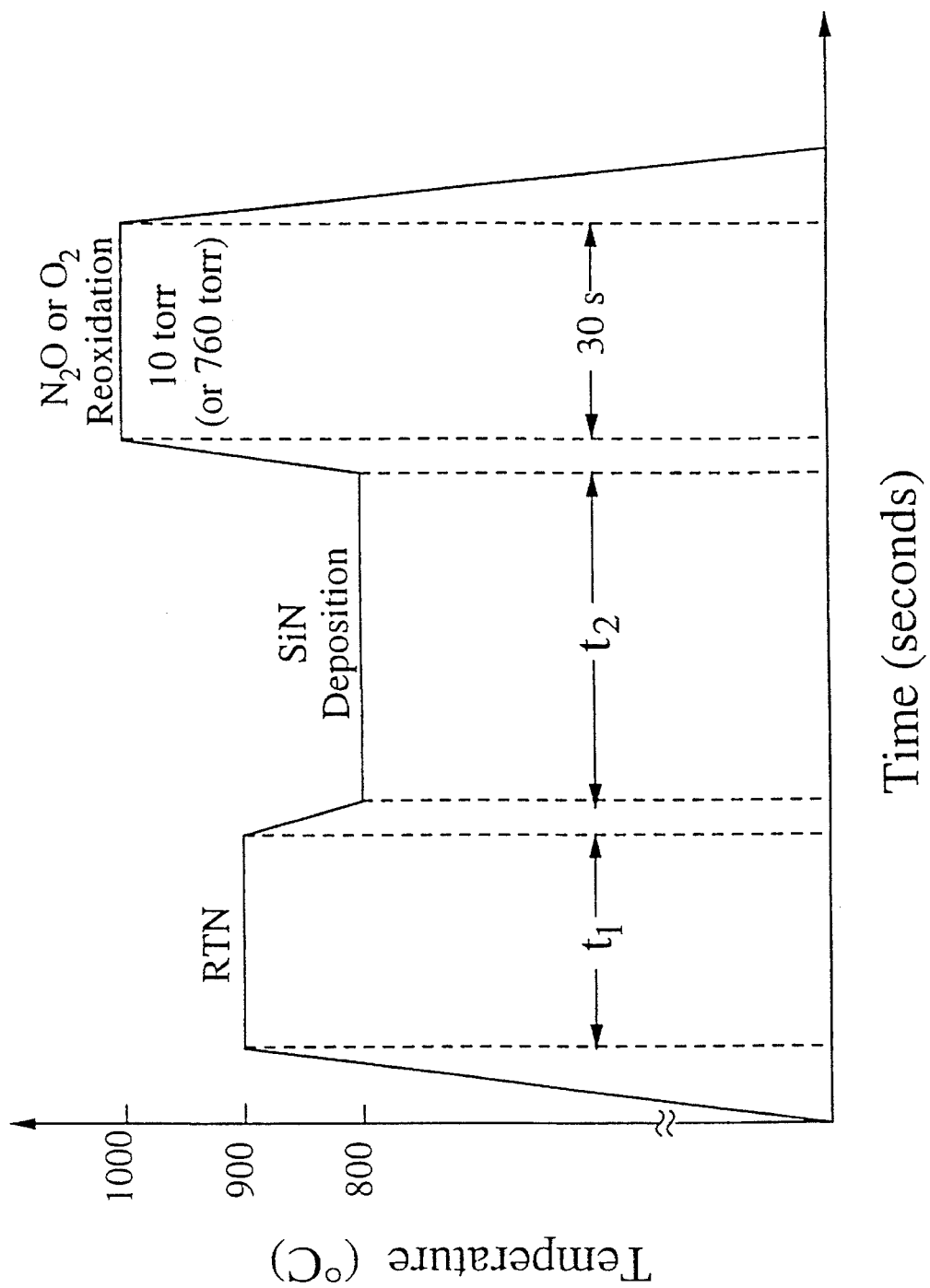
FIG. 3 is a schematic time-temperature profile of in situ rapid-thermal chemical vapor deposition (RT-CVD) for the fabrication of the dielectric layer in accordance with the invention.

The process steps in fabricating the dielectric are illustrated in the FIG. 3 schematic time-temperature of in situ rapid-thermal nitridation, $Si_3N_4$ deposition, and reoxidation. The rapid-thermal nitridation (RTN) is performed using pure $NH_3$ to remove native oxides at 10 Torr, 900° C., for different durations, $t_1$. Thereafter, in time period $t_2$, the $Si_3N_4$ film is deposited in a rapid-thermal chemical vapor deposition (RTCVD) system with deposition pressure of approximately 1.5 Torr, at 800° C., using $SiH_4$ and $NH_3$ in a ratio of 1:20 diluted in nitrogen ($N_2$). This is followed by in situ rapid-thermal reoxidation in nitrous oxide ($N_2O$) ambient at 1000° C. for 30 seconds. With wafer rotation, the film thickness uniformities have been measured to be less than ±5% for 4-inch wafers.

Capacitors fabricated using the process have included an $N^+$ polysilicon bottom electrode fabricated on P-type (100) silicon wafer covered with silicon oxide (approximately 1,000 Å) with an $N^+$-doped polysilicon top electrode. Electrical measurements were performed on polysilicon gate capacitors with areas from $1\times10^{-4}cm^2$ to $1\times10^{-2}cm^2$. High frequency C-V measurements were made to obtain the oxide equivalent thickness ($T_{ox,eq}$) of the ON stacked layer. The $T_{ox,eq}$ is calculated from the capacitance value at zero bias, adopting 3.9 as a relative dielectric constant. The effective electric field ($E_{eff}=V_g/T_{ox,eq}$) applied to the capacitor was defined as $V_g \cdot C_{ox}/\epsilon_0 \cdot \epsilon_{SiO2}$.

Figure 4:
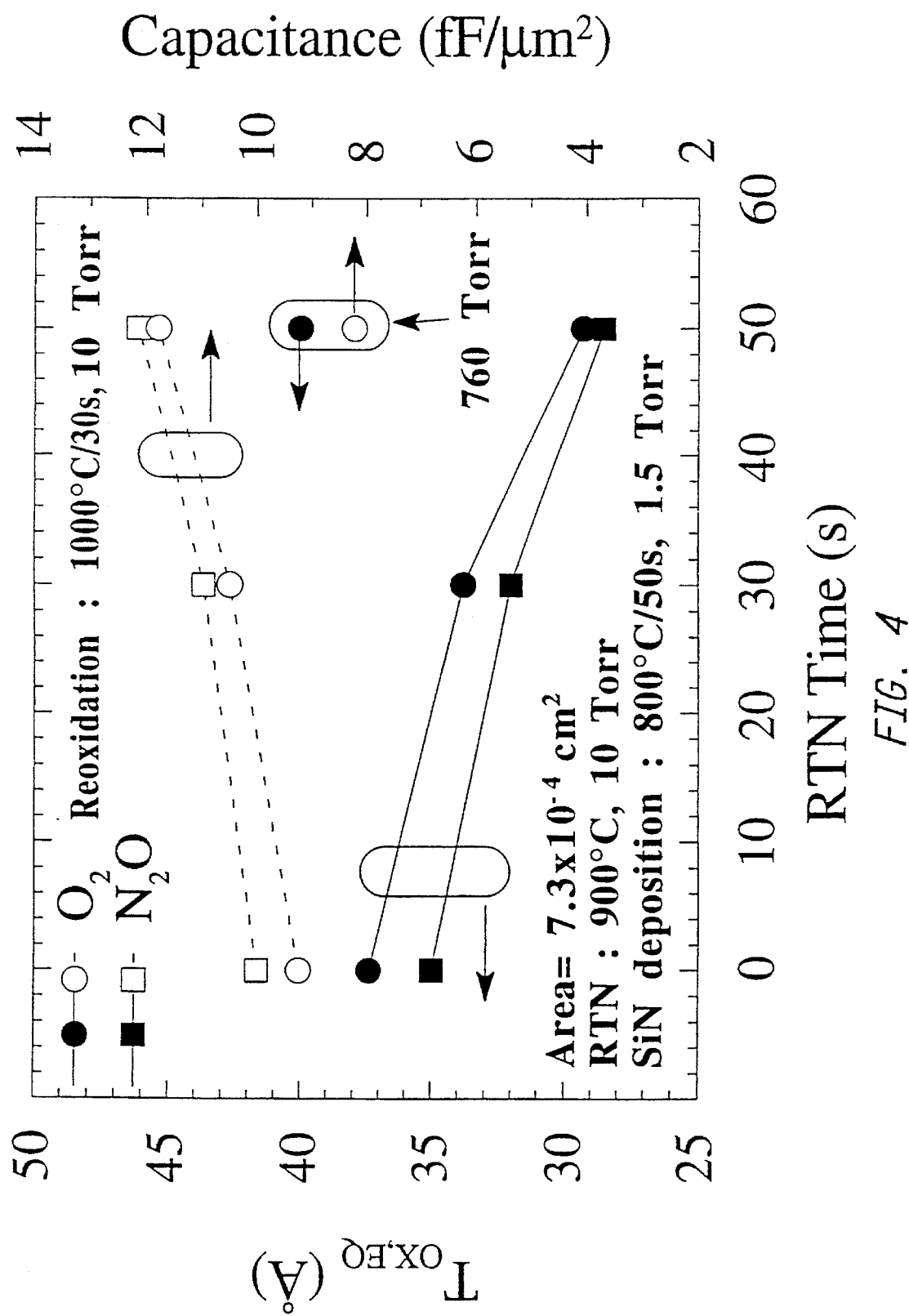
FIG. 4 illustrates oxide equivalent thickness ($T_{ox,eq}$) and capacitance as a function of rapid-thermal $NH_3$-nitridation (RTN) time in $SiO_2/Si_3N_4$ (ON) stacked film capacitors with in situ low pressure rapid-thermal $N_2O$-reoxidation (LRTNO) and in situ low pressure rapid-thermal $O_2$-reoxidation (LRTO).

FIG. 4 shows oxide equivalent thickness ($T_{ox,eq}$) variation in parallel with capacitance as a function of RTN time. $T_{ox,eq}$ is evaluated by C-V measurement using the dielectric constant of $SiO_2$. Longer RTN time shows larger capacitance (smaller $T_{ox,eq}$) due to the improved oxidation resistance of higher quality $Si_3N_4$ films by RTN treatment. As shown in the figure, ~29 Å oxide equivalent thickness (corresponding to ~12.2 fF/μm²) is obtained at 10 Torr compared to ~43 Å oxide equivalent thickness (~8.2 fF/μm²) at 760 Torr reoxidation due to its slower oxidation rate, implying that low pressure rapid-thermal reoxidation is promising for fabricating ultra thin ON stacked film.

Figure 5:
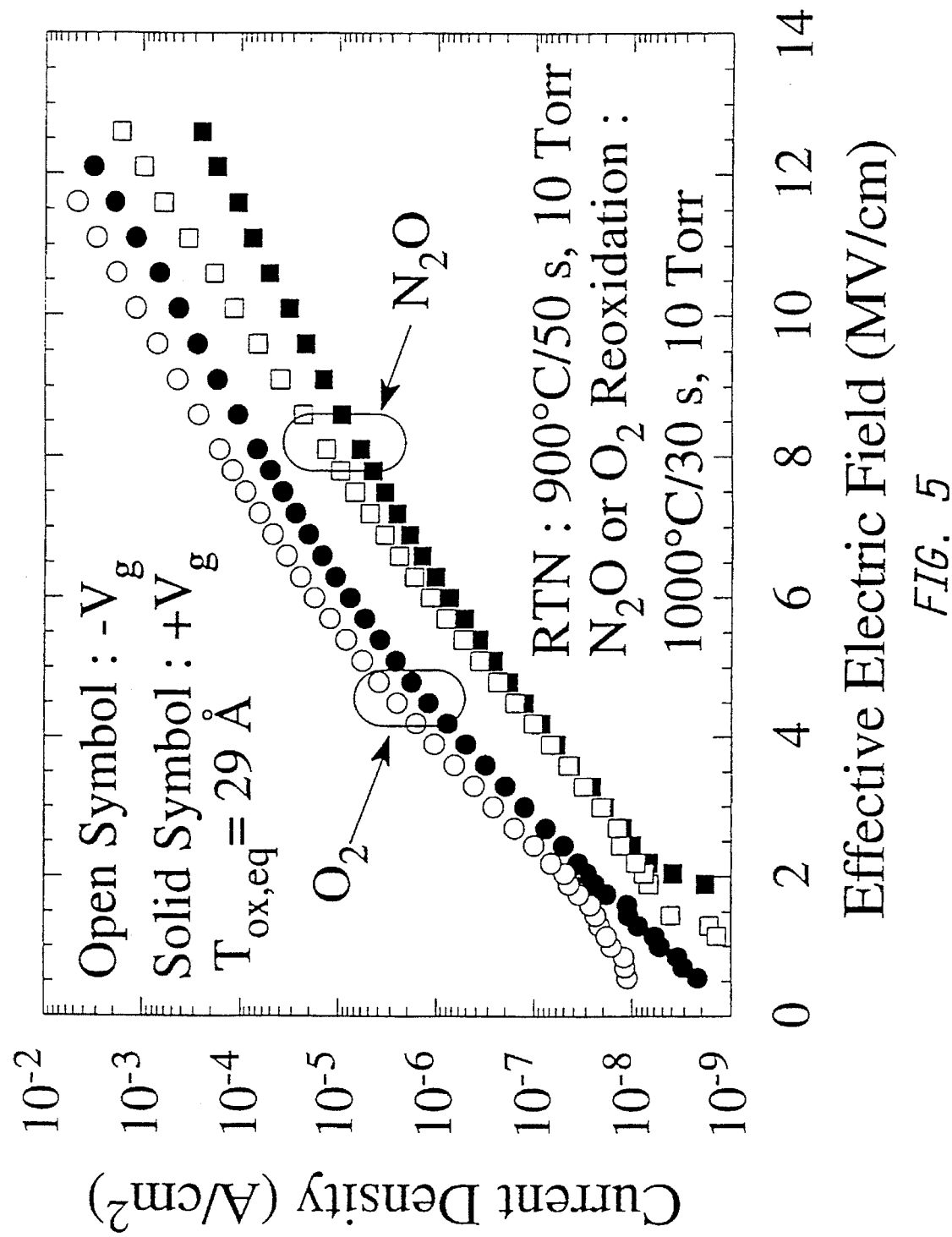
FIG. 5 illustrates current density vs. electric field (J-E) curve of ON stacked film capacitors (area=$1\times10^{-4}cm^2$) with in situ low pressure rapid-thermal $N_2O$-reoxidation and in situ low pressure rapid-thermal $O_2$-reoxidation for both gate polarities with the effective electric field calculated in terms of oxide equivalent thickness.
Figure 6:
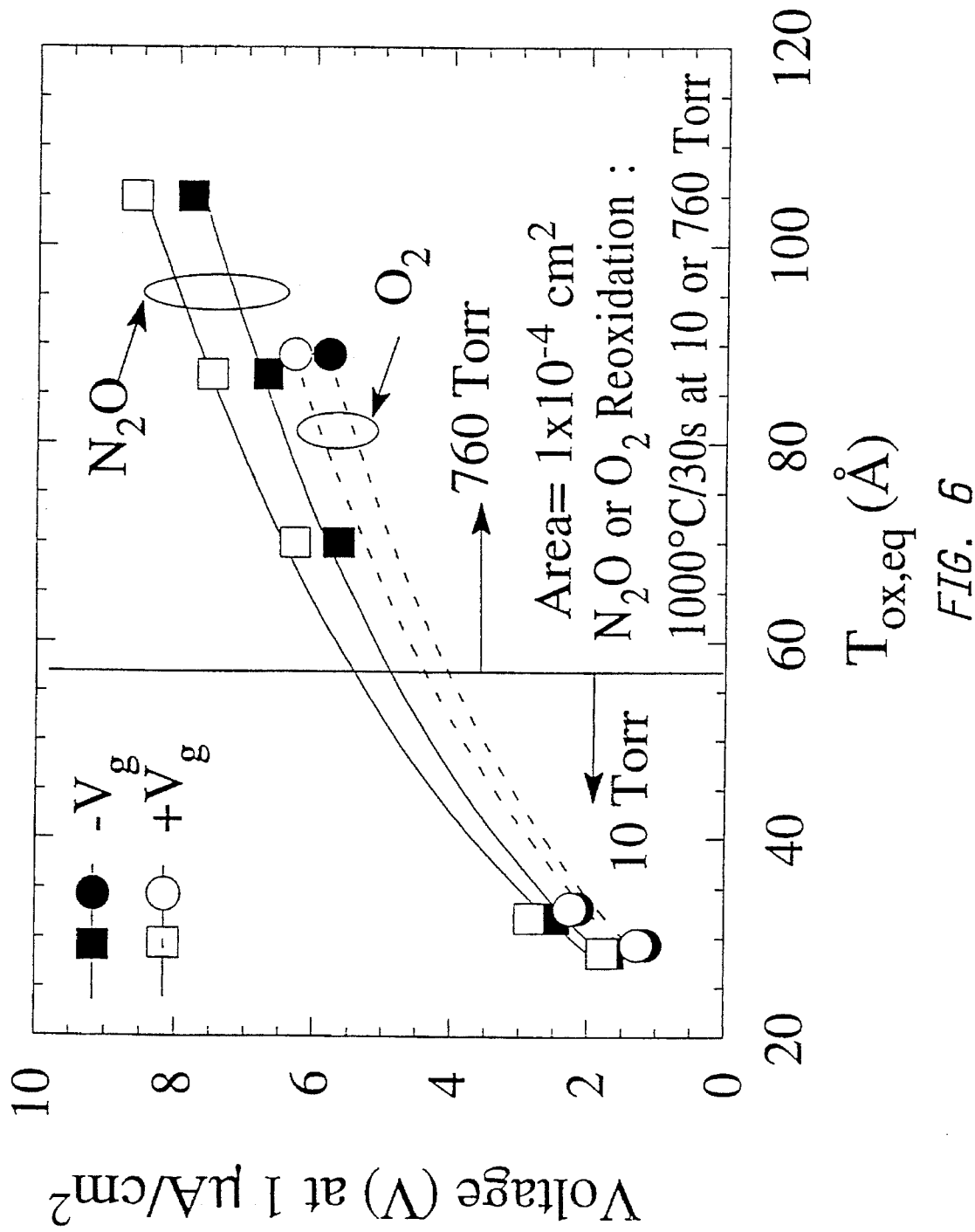
FIG. 6 illustrates Voltage (V) at 1 $\mu A/cm^2$ of ON stacked film capacitors (area=$1\times10^{-4}$ $cm^2$) with in situ rapid-thermal $N_2O$ or $O_2$ reoxidation as a function of oxide equivalent thickness ($T_{ox,eq}$).

The J-E characteristics of the ultra thin (~29 Å) ON stacked film capacitors (area=$1\times10^{-4}cm^2$) with LRTNO and LRTO for both gate polarities are shown in FIG. 5. A significant reduction in leakage current is observed for the capacitors with LRTNO as compared to those with LRTO for both gate polarities. The leakage current reduction may be due to the improvement of electrical properties of ON stacked film by $N_2O$-reoxidation. The dependence of critical voltage on oxide equivalent thickness ($T_{ox,eq}$) is shown in FIG. 6, where the critical voltage is defined as the voltage (V) at 1 μA/Cm² current density. The ON stacked film capacitors (area=$1\times10^{-4}cm^2$) with in situ $N_2O$-reoxidation show higher critical voltage as compared to those with in situ $O_2$-reoxidation, indicating that $N_2O$-reoxidation is more effective in suppressing leakage current.

Figure 7A:
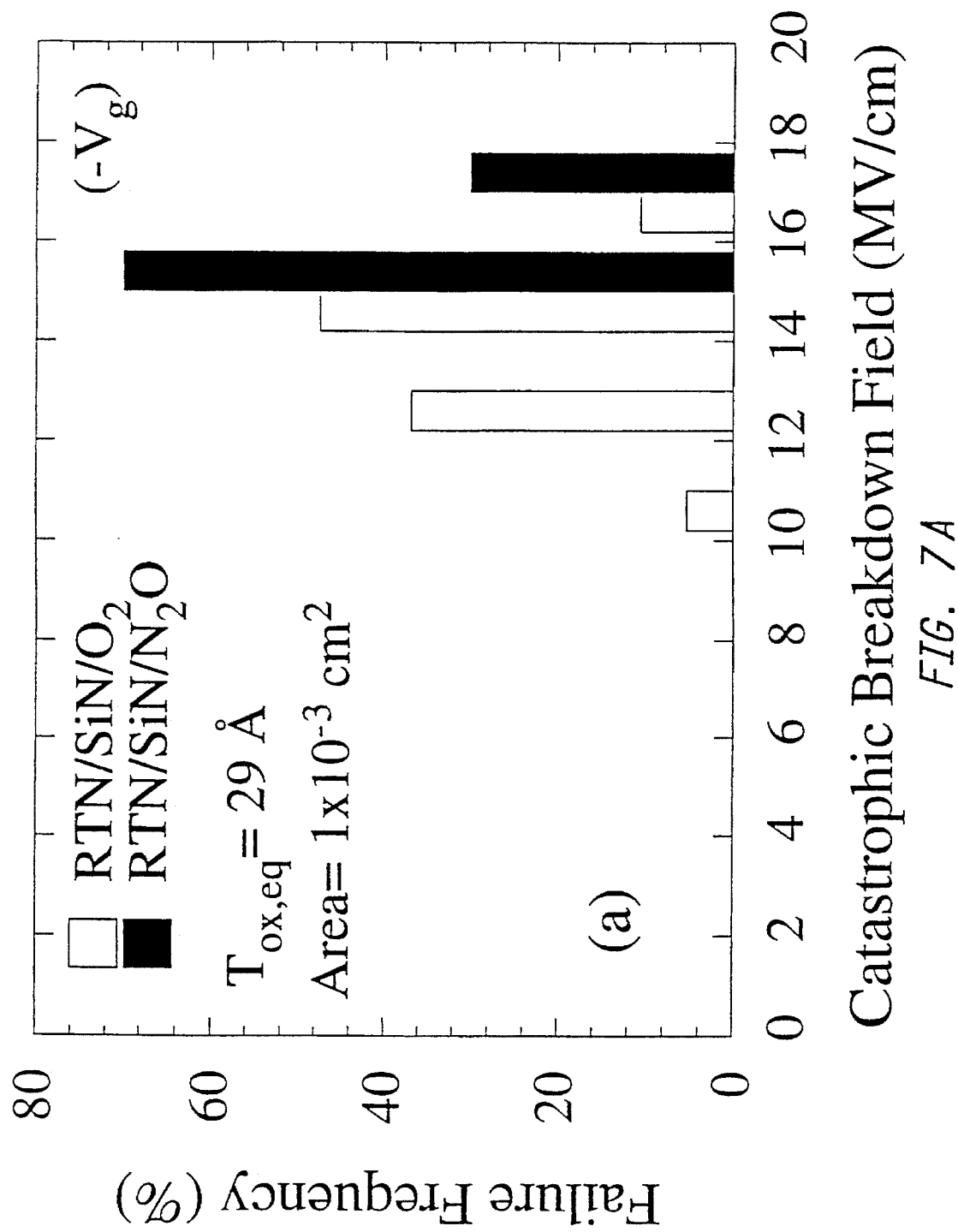
FIGS. 7A and 7B illustrate catastrophic breakdown histograms for ON stacked film capacitors with in situ low pressure rapid-thermal $N_2O$-reoxidation and in situ low pressure rapid-thermal $O_2$-reoxidation for negative gate polarity and positive gate polarity, respectively.
Figure 7B:
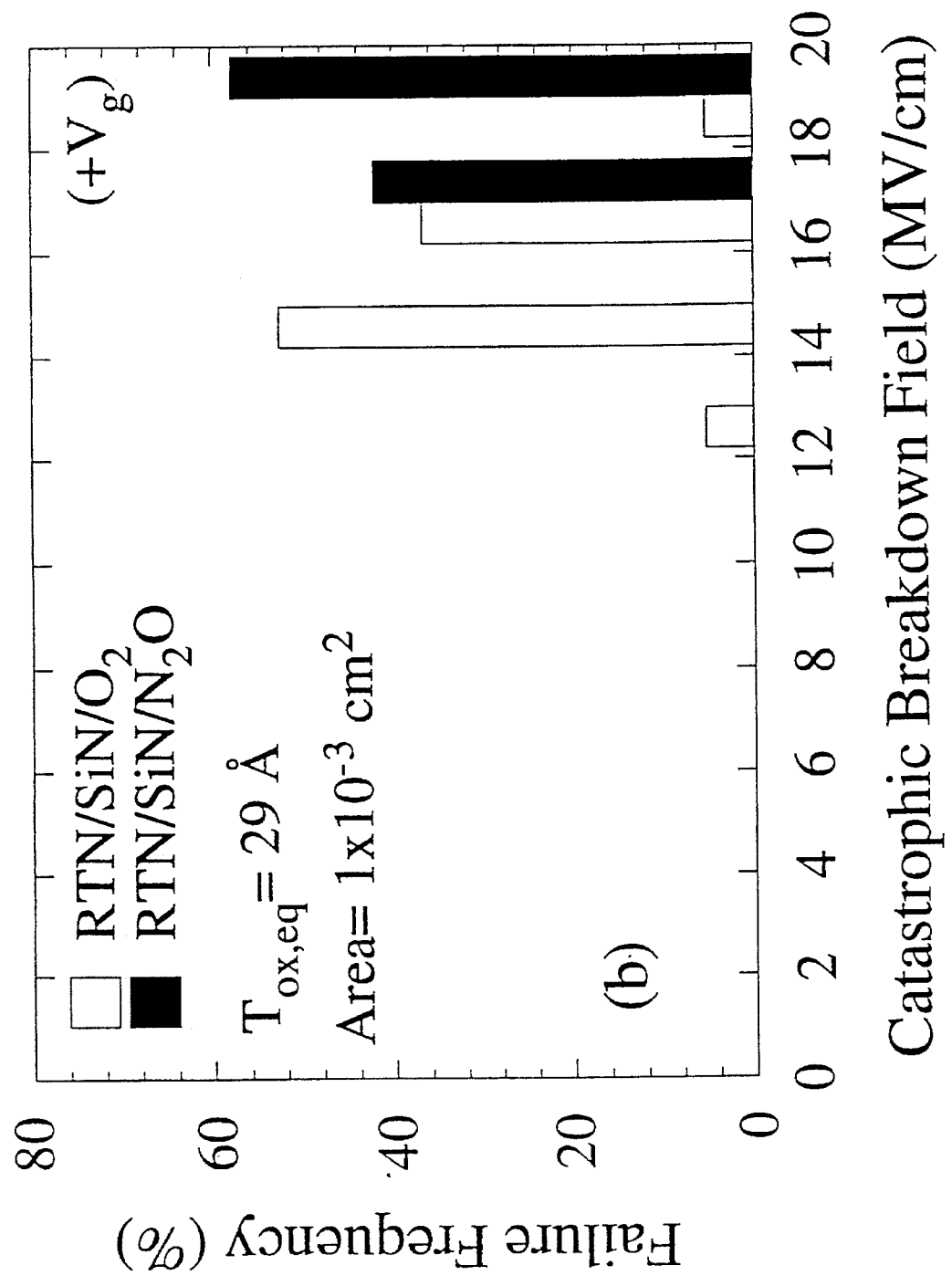

Histograms of catastrophic dielectric breakdowns obtained form ramp-voltage tests for ultra thin (~29 Å) ON stacked layer capacitors with LRTNO and LRTO for negative and positive gate polarities are shown in FIG. 7(A) and (B), respectively. Both positive and negative gate biases were applied on capacitors with an area of $1\times10^{-3}cm^2$. For each ramp-voltage condition, ~50 capacitors were tested. Capacitors with LRTNO have higher breakdown field as well as sharp distribution for both gate polarities as compared to those with LRTO.

Figure 8:
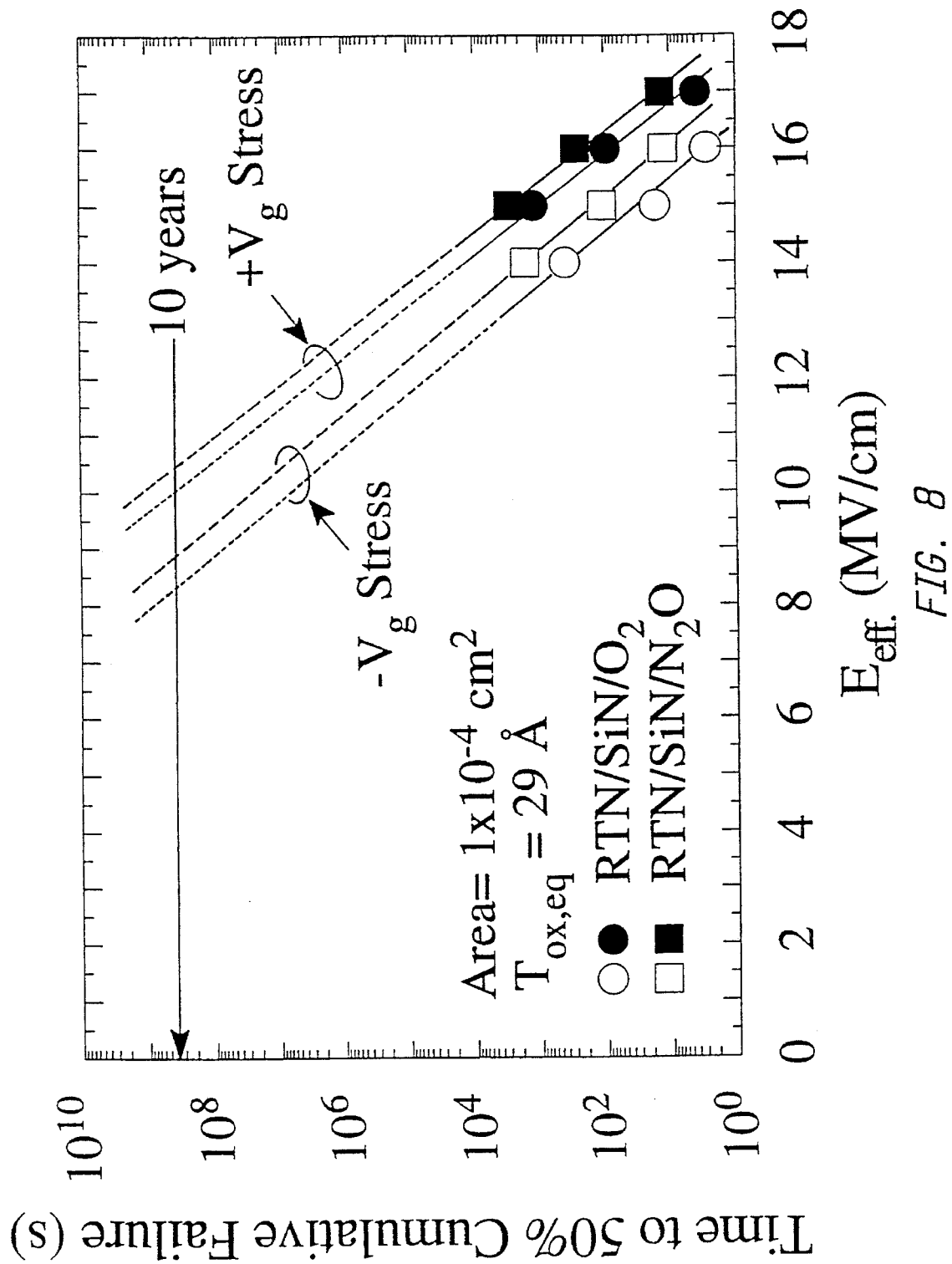
FIG. 8 illustrates a Weibull plot of TDDB data obtained under constant electric field stress ($E_{eff}$=–14 MV/cm) for ON stacked film capacitors with in situ low pressure rapid-thermal $N_2O$-reoxidation and in situ low pressure rapid-thermal $O_2$-reoxidation for negative gate polarity.

Weibull plot distributions of TDDB characteristics under constant electric field stress ($E_{eff}=-14$ MV/cm) for ultra thin (~29 Å) ON stacked layer capacitors with LRTNO and LRTO for negative gate polarity are shown in FIG. 8. To investigate area dependence of TDDB characteristics, negative gate bias was applied on small ($1\times10^{-4}cm^2$) and large ($1\times10^{-3}cm^2$) area capacitors. Capacitors with LRTNO have longer $t_{BD}$ distribution as well as sharper $t_{BD}$ distribution while those with LRTO have shorter $t_{BD}$ distribution as well as wider $t_{BD}$ distribution for large and small area capacitors. Particularly for large area capacitors, capacitors with RTNO show more defect-related breakdowns (i.e., extrinsic breakdowns) in the shorter $t_{BD}$ region as compared to those with LRTNO. The TDDB improvement in both large and small area capacitors suggests that not only the defect density is reduced by $N_2O$-reoxidation, the intrinsic film quality is also improved.

Figure 9:
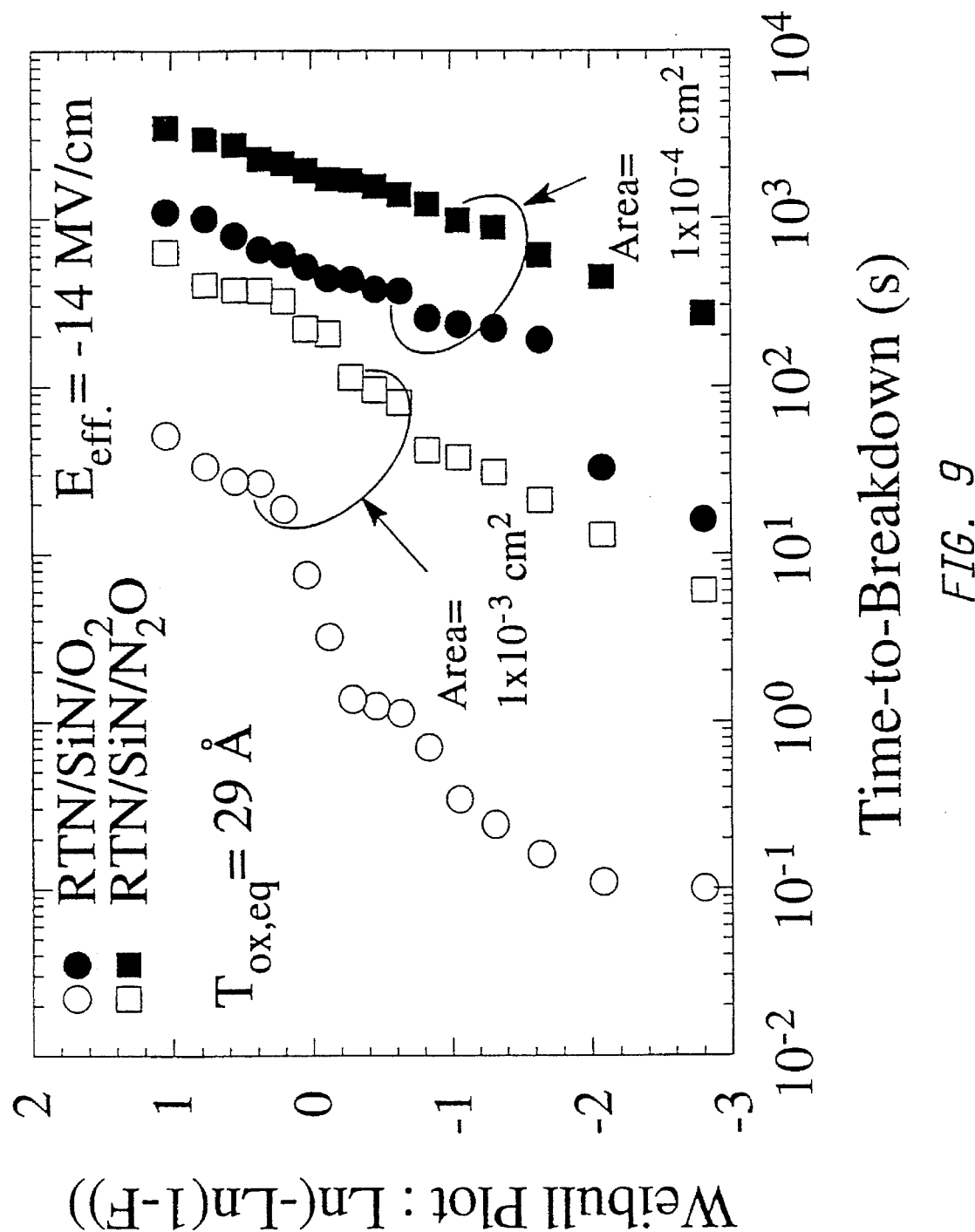
FIG. 9 illustrates electric field dependence of time to 50% cumulative failure of ON stacked film capacitors (area=$1\times10^{-4}cm^2$) with in situ low pressure rapid-thermal $N_2O$-reoxidation and in situ low pressure rapid-thermal $O_2$-reoxidation for both gate polarities.

Long-term lifetime extraction by plotting the time to 50% cumulative failure as a function of effective electric field in capacitors (area=$1\times10^{-4}cm^2$) with LRTNO and LRTO under constant voltage stress condition for both gate polarities is shown in FIG. 9. Capacitors with LRTNO show longer lifetime as compared to those with LRTO, and its lifetime long enough to survive for more than 10 years at high stress field of ~9 MV/cm.

Figure 10:
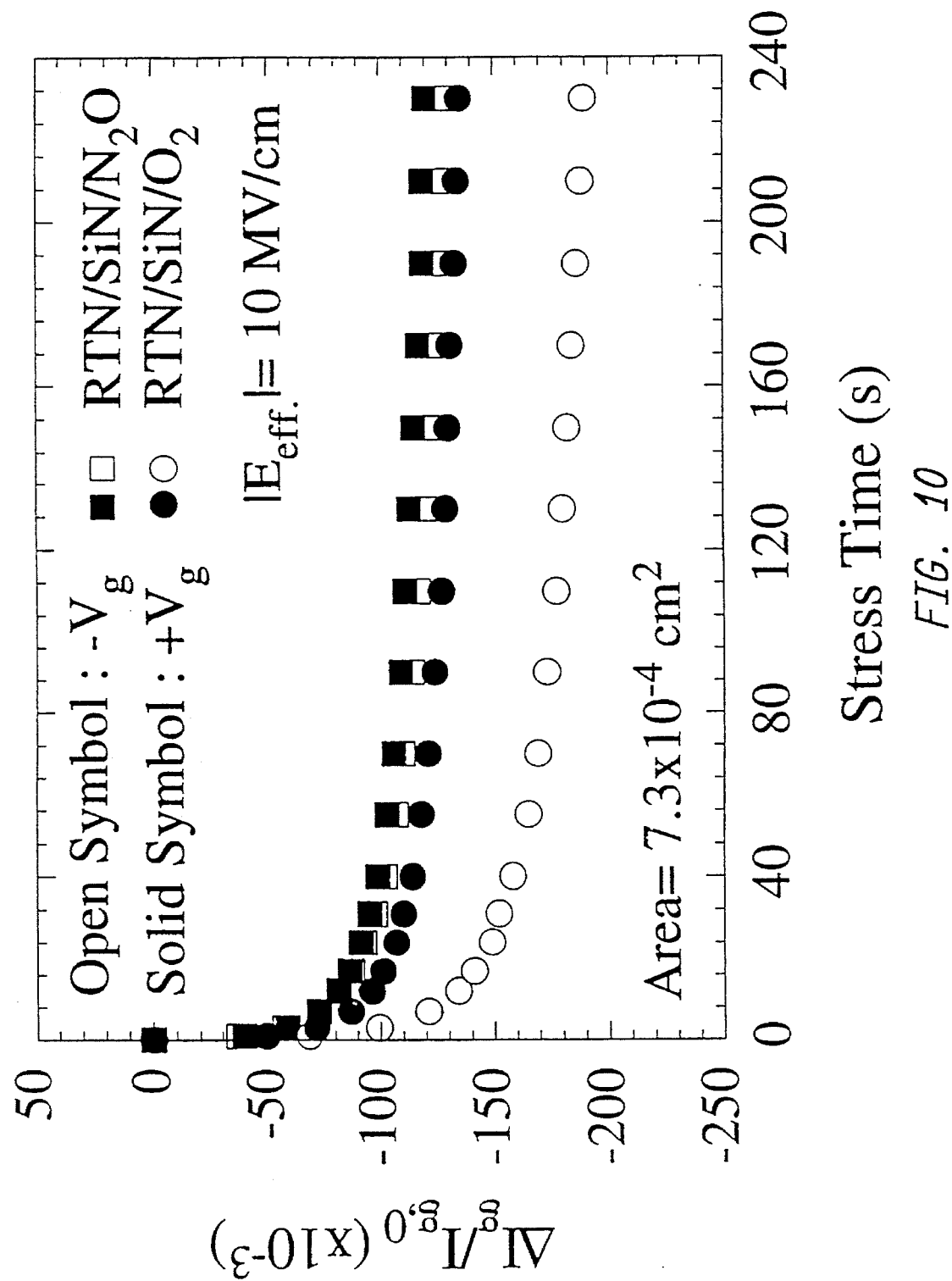
FIG. 10 illustrates leakage current shift ($\Delta I_g/I_{g,0}$) as a function of stress time of ON stacked film capacitors (area=$7.3\times10^{-4}cm^2$) with in situ low pressure rapid-thermal $N_2O$-reoxidation and in situ low pressure rapid-thermal $O_2$-reoxidation with the stress carried out under constant electric field ($|E_{eff}|$=10 MV/cm) for both gate polarities.

Charge trapping characteristics of ultra thin (~29 Å) ON stacked layer capacitors (area=$7.3\times10^{-4}cm^2$) were investigated by monitoring the change in leakage current ($\Delta I_g/I_{g,0}$) as a function of stress time under constant electric field stress ($|E_{eff}|=10$ MV/cm). As shown in FIG. 10, capacitors with LRTNO show smaller electron trapping for both gate polarities as compared to those with LRTO, particularly for negative gate polarity. In addition to excess Si, hydrogen atoms present as Si-H bonds in $Si_3N_4$ film are known to cause electron trapping. Probably, LRTNO is effective in reducing H-related species such as Si-H bonds in the $Si_3N_4$ film, resulting in ON stacked film with less electron trapping. Consequently, the less electron trapping of the ON stacked films with LRTNO leads to less field build-up within the ON stacked films, resulting in prolonged $t_{BD}$.

There has been described a novel in situ low pressure rapid-thermal reoxidation (LRTNO) of $Si_3N_4$ films using $N_2O$ which realizes high quality ON stacked films. LRTNO results in thinnest ON layers by suppressing severe oxidation. In addition, it improves the quality of ON stacked film, resulting in lower leakage current, reduced defect density and superior TDDB characteristics as compared to LRTO. The dielectric is especially useful for high-density DRAM applications in the capacitor elements and in the MOS transistors.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of in situ forming a dielectric layer on a silicon surface of a substrate in an electronic device comprising the steps of a) exposing said silicon surface to an atmosphere of $NH_3$ at a first elevated temperature for a first period of time to remove native oxides and form a first $Si_3N_4$ layer, b) chemical vapor depositing a second $Si_3N_4$ layer on said first $Si_3N_4$ layer, and c) forming an oxynitride layer on said second $Si_3N_4$ layer by heating said second $Si_3N_4$ layer at a second temperature for a second period of time in an atmosphere of nitrous oxide.

2. The method as defined by claim 1 wherein step c) is carried out at a pressure of approximately 10 Torr at approximately 1,000° C. for approximately 30 seconds.

3. The method as defined by claim 2 wherein step b) is carried out in an atmosphere of $SiH_4$ and $NH_3$ at a ratio of 1:20 diluted in $N_2$.

4. The method as defined by claim 3 wherein step b) is carried out with a deposition pressure of approximately 1.5 Torr at a temperature of approximately 800° C.

5. The method as defined by claim 4 wherein step a) is carried out at a temperature of approximately 900° C.

6. The method as defined by claim 1 wherein step b) is carried out in an atmosphere of $SiH_4$ and $NH_3$ at a ratio of 1:20 diluted in $N_2$.

7. The method as defined by claim 6 wherein step b) is carried out with a deposition pressure of approximately 1.5 Torr at a temperature of approximately 800° C.

8. The method as in claim 7 wherein step a) is carried out at a temperature of approximately 900° C.

9. The method as in claim 1 wherein step a) is carried out at a temperature of approximately 900° C.

* * * * *